United States Patent [19]

Intrator

[11] 3,967,296

[45] June 29, 1976

[54] SEMICONDUCTOR DEVICES

[75] Inventor: Alexander M. Intrator, Dewitt, N.Y.

[73] Assignee: General Electric Company, Syracuse, N.Y.

[22] Filed: Oct. 12, 1972

[21] Appl. No.: 296,792

[52] U.S. Cl. .............................. 357/80; 357/68; 357/71; 317/101 R
[51] Int. Cl.² .................. H01L 39/02; H01L 23/48; H01L 29/46; H02B 1/04
[58] Field of Search ............. 317/234 (5.4), 4, 101; 357/68, 71, 80

[56] References Cited
UNITED STATES PATENTS

| 3,405,361 | 10/1968 | Kattner et al. | 324/158 |
| 3,474,297 | 10/1969 | Bylander | 317/101 |
| 3,657,610 | 4/1972 | Yamamoto et al. | 317/234 |

*Primary Examiner*—Edward J. Wojciechowicz
*Attorney, Agent, or Firm*—R. J. Mooney; D. E. Stoner

[57] ABSTRACT

A semiconductor device in which a top-contact semiconductor body is thermo-electrostatically face down bonded to a vitreous support carrying patterned metallization forming leads registered with the top contacts, and a protective insulative coating is provided over at least portions of the leads to preclude shortcircuiting to exposed portions of the semiconductor body.

5 Claims, 3 Drawing Figures

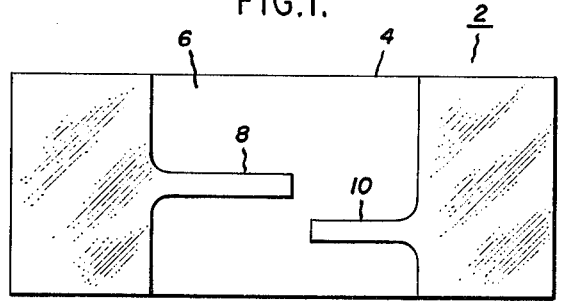
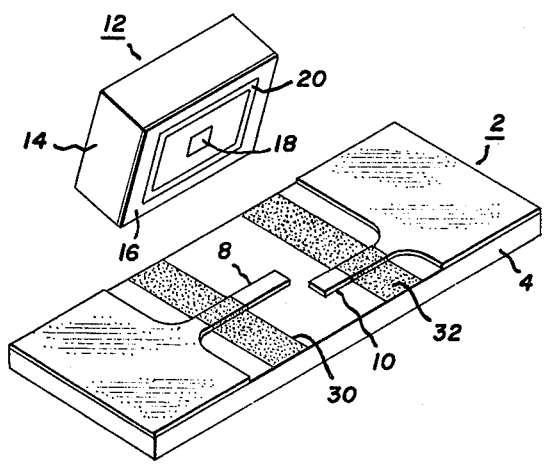
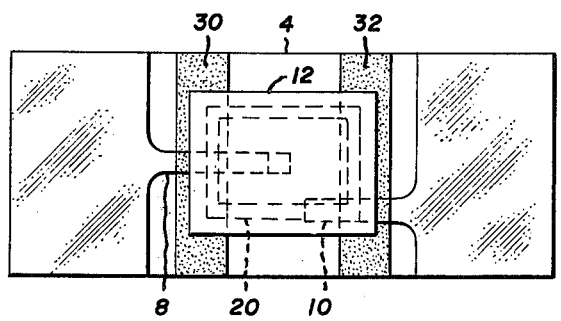

SEMICONDUCTOR DEVICES

The present invention relates to improvements in semiconductor products such as transistors, photon-responsive diodes and thyristors, and the like. More particularly, the present invention relates to an improved integral assembly of a semiconductor body constituting a transistor, diode, thyristor or the like having surface contact regions, and substrate-supported electrical leads extending from such contact regions for connection to associated circuitry.

One object of the present invention is to provide an improved semiconductor device including a semiconductor body and associated substrate-supported external leads, which is rugged, inexpensive, easy to handle, and particularly suitable for low cost high volume manufacture by equipment utilizing a minimum of direct labor.

This and other objects of the present invention will be apparent from the following description and the accompanying drawing wherein:

FIG. 1 is a plan view of one portion of a semiconductor device constructed in accordance with the present invention;

FIG. 2 is a perspective view of the structure in FIG. 1 and further showing, in exploded relation, the related semiconductor body portion of a semiconductor device constructed in accordance with the present invention; and FIG. 3 is a plan view showing in fully assembled relation the elements shown separated in FIG. 2.

Turning to FIG. 1, there is shown a subassembly 2, consisting of an electrically insulative supporting substrate 4, which may be, for example, a plate of vitreous material such as a glass or ceramic material. The exact composition of the vitreous supporting substrate 4 is not critical, and it may consist, for example, of any of a variety of commercially available inexpensive glasses such as the lead glasses, zinc borosilicate glasses, or the like, or various vitreous ceramic materials such as aluminum oxide, forsterite, aluminum nitride, beryllium oxide, or the like. Thus the member 4 will hereinafter be referred to for convenience simply as "glass". In applications where transparency of the glass member 4 to a particular kind of radiation, such as visible light, or infrared radiation, is desired, this factor will, of course, affect the choice of the material for the glass member.

On one major face 6 of the glass support 4 is provided a plurality of electrically conductive leads 8, 10. Each lead 8, 10 may consist, for example, of a thin metallic member or layer having a bottom face contacting and united to the face 6 of the glass 4, and having an upper exposed major face. Each lead may be constituted of a thin layer of a suitable metal, such as aluminum, titanium, molybdenum, or a laminate of, for example, gold over titanium, configured in a selected pattern for desired registry with a semiconductive body to be mounted on the subassembly 2.

The leads 8, 10 may be provided on glass support 4 in any of a variety of ways known to those skilled in the art, such as vapor deposition through a template in the form of a suitably apertured mask, metallization of the entire glass surface followed by selective removal of unwanted areas, or selective application of a conductive slurry or paste to the glass which is then fired in place in the selected areas corresponding to the desired shape of the leads. The lead metallization may have a thickness of, for example, 0.01 to 1.00 mils, and the glass member may have a thickness of, for example, 5 to 500 mils.

Mounted on subassembly 2 is a semiconductor body 12 which, as shown in FIGS. 2 and 3, consists of a chip or pellet of semiconductor material such as monocrystalline silicon, gallium arsenide, or the like, having opposed major faces and within which is provided electrically associated regions (not shown) such as, for example, transistor collector, base, and emitter regions. The body 12 may preferably be of the so called planar type, having bare side walls 14 and having one major face provided with, as is well known in the art, an electrically insulative and passivating coating 16. The coating 16 may be of a material known to those skilled in the art to be suitable for such insulative passivating purpose, such as, for example, silicon oxide, silicon oxy-nitride, or a combination of silicon oxide and nitride. Typically, the coating 16 may have a thickness of, for example, 5,000 to 30,000 Angstroms. Situated within openings in the insulative coating 16 are contacts 18, 20 of electrically conductive material directly connected to respective underlying portions of the semiconductor body. Contacts 18, 20 have exposed exterior faces adapted to be electrically connected to respective extending external leads.

The semiconductor body 12 is united to the subassembly 2 consisting of the support 4 and external leads 8, 10 by being bonded, contact face down, to the subassembly. The body 12 is so positioned relative to the leads 8, 10, and the leads are so dimensioned and located, that a portion of each lead is registered with and electrically connected to a respective contact on the body. Thus, when the body and lead subassembly are joined as shown in FIG. 3, the end portion of lead 8 is connected to contact 18 and the end portion of lead 10 is connected to contact 20. The outer end portions of the respective leads, most remote from body 12, are substantially expanded in area to provide sites facilitating connection of other lead members which may be of substantially larger size than the inner end portions of leads 8, 10.

Desirably, in accordance with my invention, the semiconductor body 12 is bonded to the glass support 4 by a novel magnetic field-enhanced thermo-electrostatic process described fully and claimed in U.S. patent application Ser. No. 217,117, filed Jan. 12, 1972 in the names of N. Adams and E. A. Baum as inventors, and assigned to the assignee of the present invention. In the referenced Adams and Baum patent application, Ser. No. 217,117, a process is disclosed and described for uniting one or more vitreous insulative members with one or more metallic conductive members or a combination of one or more metallic members and one or more bodies of semiconductor material. Such members are united by the application of heat and a magnetic field and an electrostatic field. The magnetic field has flux lines extending in the plane of the surfaces to be united and has an intensity of about 3,000 to 20,000 gauss, while the heating is sufficient to bring the surfaces to be united up to a temperature of about 300° to 450°C, and the electrostatic field has an intensity of 200 to 500 volts and is applied by placing a pair of electrodes in contact with the elements to be united. It is a particular feature of the above-described thermo-electrostatic bonding process that the other glass-confronting areas of the semiconductor body 12 and passivating coating 16 are united to the glass 4 at the same time, so that the entire glass-confronting surface of the semiconductor body is effectively intimately bonded to the glass member and is thereby permanently affixed to it and supported by it.

A particular feature of the invention is that special provision is made to preclude shortcircuiting of the leads 8, 10 to the side walls 14 of the semiconductor body 12, such shortcircuiting otherwise having been found likely to occur at the location where each respective lead 8, 10 emerges from beneath the bonded semiconductor body 12 and extends outwardly past the side wall of body 12, as best shown in FIG. 3. To prevent such shortcircuiting, in accordance with my invention, respective insulative coatings 30, 32 are laid over the leads 8, 10 as best shown in FIGS. 2 and 3, in the proper locations so as to insulatively separate each lead from the body 12 throughout the area where the lead emerges from beneath the body. The insulative coatings 30, 32 may consist, for example, of any suitable material such as a layer of silicon oxide, silicon nitride, aluminium oxide or other insulating film capable of being applied controllably in thin layers and capable of withstanding process temperatures up to, for example, 800°C without degradation or contamination of the associated portions of the device. Such insulating coatings insure against shorting of the conductive leads 8, 10 past the passivating coating 16 to the exposed sidewall 14 of the semiconductor body or other conductive regions connected to the semiconductor body. This eliminates need for any special geometrical design or pattern for the leads 8, 10 or the contact regions 18, 20 on the semiconductor body, and thereby facilitates use of standard contact and lead geometries for maximum cost effectiveness.

The insulative coatings 30, 32 may be applied in any desired manner, for example by evaporation, pyrolysis, sputtering, painting, or any other suitable coating or deposition means or techniques. I have found that a suitable thickness for the coatings 30, 32 is from 1,000 to 20,000 Angstroms In one exemplary embodiment of semiconductor device constructed in accordance with the present invention, the glass support 4 was about 6 mils thick and was about 40 mils wide and 50 mils long. Aluminum metallization on the glass constituted leads 8, 10, and was about 10,000 to 20,000 Angstroms thick applied by conventional vapor plating techniques. The semiconductor body 12 was a monocrystalline silicon pellet about 10 mils thick, subdivided from a parent wafer of the same thickness and substantially larger area, having a top surface of aobut 30 mils by 30 mils covered with an insulating passivating layer 16 of silicon dioxide having a thickness of about 8,000 to 20,000 Angstroms. The semiconductor body included emitter, base, and collector regions separated by emitter and collector PN junctions and had, on its surface confronting the glass 4, emitter and base contacts 18, 20 of aluminum provided in apertures in layer 16. The alminum contacts were about 10,000 Angstroms thick and were applied by conventional vapor plating techniques. The exposed or bottom major face of the semiconductor body 12 likewise was provided with a suitable metallic contact of, for example, gold, not shown. The insulative layers 30, 32 overlying the external leads of the glass were silicon oxide having a thickness of about 5,000 Angstroms, deposited by conventional vapor plating techniques, and so spaced and arranged as to be generally parallel with two of the four side walls 14 of the semiconductor body 12 and extending inward beneath the body about 10 mils and outward beyond the side walls of the body 12 approximately 10 mils.

The resulting structure as shown in FIG. 3 completely eliminates any flying lead wires or the need to attach such flying leads to body 12 by thermal compression bonds or the like. Thus the present invention eliminates a substantial amount of direct labor previously concerned with making thermal compression bonds in the assembly of the total device. Moreover, even though in accordance with the thermo-electrostatic bonding process above described the bonds between the metallization 8, 10 on the glass 4 and the glass itself and the semiconductor body 12 and coating 16 are of exceptional tenacity and are of a substantially hermetic quality, even to the extent of slightly plastically deforming the sealing surface of glass 4 and drawing it into intimate sealing contact with the confronting surface of the semiconductor body, the presence of the insulative strips 30, 32 insures that the external leads 8, 10 will be positively prevented from making shortcircuiting contact with the side walls of the semiconductor body. Thus, in accordance with the present invention an unusually rugged assembly of diminutive size, yet substantial strength can be made essentially automatically and inexpensively, with the integrity of all desired electrical connections assured yet positive prevention of any shortcircuiting to the semiconductor body side walls equally assured.

It will be appreciated by those skilled in the art that the invention may be carried out in various ways and may take various forms and embodiments other than the illustrative embodiments heretofore described. Accordingly, it is to be understood that the scope of the invention is not limited by the details of the foregoing description, but will be defined in the following claims.

What I claim as new and desire to secure by Letters Patent of the United States is:

1. In a semiconductor device, a semiconductor body having at least one metallic contact situated on a major face thereof, a glass support member having a sealing surface, a layer of metal on at least a portion of said sealing surface adapted to constitute at least one electrical lead for the semiconductor body, said semiconductor body and said sealing surface being disposed in confronting contacting relation with said metallic contact in registry with said lead, means forming a permanent thermo-electrostatic bond uniting said support member to said semiconductor body, and an insulative layer on said support member covering at least the portion of said lead nearest the side wall of said semiconductor body, said insulative layer having a thickness of about 1000 to 20000 Angstroms and being sandwiched between direct contact with said lead and direct contact with the outer marginal edge portion of the major face of said semiconductor body to prevent shortcircuiting of said lead to said semiconductor body sidewall during or subsequent to the formation of said bond.

2. A semiconductor device as defined in claim 1 wherein said semiconductor body includes at least one PN junction.

3. A semiconductor device as defined in claim 1 wherein said insulative layer is silicon oxide.

4. A semiconductor device as defined in claim 3 wherein said lead is aluminum.

5. A semiconductor device as defined in claim 1 wherein said insulative layer completely covers at least the portion of said lead extending from a point a few mils inboard of the side wall of said semiconductor body to a point a few mils outboard of said sidewall.

* * * * *